(12) United States Patent
Sohda et al.

(10) Patent No.: US 7,884,325 B2
(45) Date of Patent: Feb. 8, 2011

(54) ELECTRON BEAM MEASUREMENT APPARATUS

(75) Inventors: Yasunari Sohda, Kawasaki (JP); Shoji Hotta, Delmar, NY (US); Shinji Okazaki, Saitama (JP); Muneyuki Fukuda, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 237 days.

(21) Appl. No.: 12/328,161

(22) Filed: Dec. 4, 2008

(65) Prior Publication Data

US 2009/0146057 A1    Jun. 11, 2009

(30) Foreign Application Priority Data

Dec. 6, 2007    (JP) .............................. 2007-315940

(51) Int. Cl.
G01N 23/00    (2006.01)
G21K 7/00    (2006.01)
(52) U.S. Cl. .................. 250/310; 250/306; 250/307; 250/309; 250/311; 250/397; 356/394
(58) Field of Classification Search .............. 250/306, 250/307, 309–311, 397; 356/394; 850/9, 850/10
See application file for complete search history.

(56) References Cited

U.S. PATENT DOCUMENTS

| 6,167,355 A * | 12/2000 | Fiekowsky | .................. 702/159 |
| 7,231,079 B2 * | 6/2007 | Okuda et al. | ................. 382/145 |
| 2007/0145270 A1* | 6/2007 | Miyamoto et al. | .......... 250/310 |
| 2009/0136116 A1* | 5/2009 | Okai et al. | .................. 382/144 |

OTHER PUBLICATIONS

Semiconductor International Web-version http://www.sijapan.com/issue/2007/04/u3eqp3000001dd9m.html.

* cited by examiner

*Primary Examiner*—Jack I Berman
*Assistant Examiner*—Meenakshi S Sahu
(74) *Attorney, Agent, or Firm*—Mattingly & Malur, P.C.

(57) ABSTRACT

The present invention provides an electron beam measurement technique for measuring the shapes or sizes of portions of patterns on a sample, or detecting a defect or the like. An electron beam measurement apparatus has a unit for irradiating the patterns delineated on a substrate by a multi-exposure method, and classifying the patterns in an acquired image into multiple groups according to an exposure history record. The exposure history record is obtained based on brightness of the patterns and a difference between white bands of the patterns.

12 Claims, 10 Drawing Sheets

SECONDARY ELECTRON IMAGE

REFLECTIVE ELECTRON IMAGE

ELECTRON BEAM MEASUREMENT APPARATUS

CLAIM OF PRIORITY

The present application claims priority from Japanese patent application JP 2007-315940, filed on Dec. 6, 2007, the content of which is hereby incorporated by reference into this application.

BACKGROUND OF THE INVENTION

The present invention relates to an electron beam measurement technique for measuring the shapes or sizes of portions of patterns on a sample, or detecting a defect or the like.

In recent years, a semiconductor element has been miniaturized, and dimensional control with high accuracy has been demanded. With the miniaturization of the semiconductor element, the wavelength of light used in a lithographic process has been reduced. In the most currently advanced factory, an ArF excimer laser (having a wavelength of 193 nm) is used. In order to miniaturize the semiconductor element, an extreme ultraviolet (EUV) lithography using light with a wavelength of 13 nm is considered as a candidate. However, since the wavelength of light used in the EUV lithography is shorter by one digit or more than that of the ArF excimer laser, there is a controversy whether or not it is possible to smoothly switch to the EUV lithography. As an alternative solution, a multi-exposure scheme has been proposed.

As an example of the multi-exposure scheme, a process flow of a double patterning technique (refer to, for example, SEMICONDUCTOR International Web-version: http://www.sijapan.com/issue/2007/04/u3eqp3000001dd9m.html) is shown in FIGS. 1A to 1G. As shown in FIG. 1A, a substrate W has a processed layer TL, a hard mask layer HM and a first resist layer RL1. The hard mask layer HM is provided on the processed layer TL. The first resist layer RL1 is provided on the hard mask layer HM.

In a first exposure, a first exposure pattern EP1 is delineated in the first resist layer RL1 by an exposure apparatus (as shown FIG. 1B) and developed (as shown in FIG. 1C). Next, the hard mask layer HM is etched such that the first pattern is transferred into the hard mask layer HM as shown in FIG. 1D.

Then, an antireflection film BARC is formed in order to perform a second exposure. After that, a second resist layer RL2 is formed (as shown in FIG. 1E). The second exposure is performed by using an appropriate reticle in the same way as the first exposure such that a second exposure pattern EP2 is delineated in the second resist layer RL2 (as shown in FIG. 1E) and developed (as shown in FIG. 1F). A portion of the second exposure pattern EP2 is located between portions of the first exposure pattern EP1. This makes it possible to delineate a fine pattern (that cannot be delineated by a single exposure due to a lack of resolution) in a single layer.

Next, the processed layer TL is etched using the second resist layer RL2, the antireflection film BARC, and the hard mask layer HM as masks. Then, the second resist layer RL 2 and the antireflection film BARC are peeled off. A pattern of the processed layer TL is formed as shown in FIG. 1G. In this case, the hard mask layer HM is typically not removed. The wafer is inspected in this state (shown in FIG. 1G).

SUMMARY OF THE INVENTION

Conventionally, only a sample subjected to a single exposure is targeted in the case where an electron beam measurement apparatus measures the sizes of portions of patterns on the sample. That is, it has been unclear how to measure a sample subjected to a multi-exposure scheme and having a pattern that includes portions having shapes different from each other in a vertical direction.

It is, therefore, an object of the present invention to provide a technique which uses an electron beam to measure a sample manufactured by a multi-exposure scheme.

To accomplish the object, it is effective to provide means for classifying patterns in an image acquired by charged beam scanning into multiple groups according to an exposure history record, based on brightness of the patterns and a difference between white bands of the patterns. In addition, it is preferable to provide means which uses an image processing parameter or a waveform processing parameter for each of the groups, and measuring the size of a portion of a pattern, the position of the contour of the pattern, or a relative positional relationship be conducted. In this case, the used parameter varies depending on the group.

As the means for classifying the patterns into groups, it is effective to provide means for comparing an acquired image with a design database. As the means for measuring the size of a portion of a pattern or the position of the contour of the pattern, a reference image or a reference waveform may be used. It is also effective to provide means which uses conditions for image acquisition itself to acquire images that have the same pattern and are different from each other, and processes the images.

Representative configuration examples of the present invention are described below.

(1) An electron beam measurement apparatus, which measures, based on information on an image, a pattern formed on a sample, comprising: an electron optical system that uses a lens and a deflector to scan a predetermined observation region on a sample with an electron beam emitted from an electron source; a detector for detecting a charged particle secondarily generated from the sample by irradiation with the electron beam; and means for forming an image based on the detected charged particle. The electron beam measurement apparatus includes means for classifying patterns, which are included in an image acquired by the irradiation with the electron beam on the patterns on the sample, into groups according to an exposure history record. The exposure history record is obtained based on brightness of the patterns included in the image and a difference between shapes of white bands of the patterns. The patterns are delineated in a single layer present on a substrate by a multi-exposure method. Image processing or waveform processing is preformed on each group, the processing varying depending on the classified group.

(2) The electron beam measurement apparatus having the configuration described in item (1), wherein the patterns are classified into the groups based on an image formed based on a secondary electron of the charged particle and an image formed based on a reflective electron of the charged particle.

(3) The electron beam measurement apparatus having the configuration described in item (1), wherein the patterns are classified into the groups according to the exposure history record by comparing the acquired image with a design database.

(4) The electron beam measurement apparatus having the configuration described in item (1), wherein the patterns are classified into the groups such that a pattern having portion arranged alternately is included in one of the groups that is different from the other group including the other pattern.

(5) The electron beam measurement apparatus having the configuration described in item (1), wherein an image processing parameter or an waveform processing parameter is used for each of the classified groups to obtain the size of a portion of the pattern included in the group or the position of the contour of the portion of the pattern, the used parameter varying depending on the group.

(6) The electron beam measurement apparatus having the configuration described in item (1), wherein a reference image or a reference waveform is used for each of the classified groups to obtain the size of a portion of the pattern included in the group or the position of the contour of the portion of the pattern, the used reference image or the used reference waveform varying depending on the group.

(7) The electron beam measurement apparatus having the configuration described in item (1), wherein information on a relative positional relationship between the classified groups is obtained.

(8) An electron beam measurement apparatus, which measures, based on information on an image, a pattern formed on a sample, comprising: an electron optical system that uses a lens and a deflector to scan a predetermined observation region on a sample with an electron beam emitted from an electron source; a detector for detecting a charged particle secondarily generated from the sample by irradiation with the electron beam; and means for forming an image based on the detected charged particle, the patterns being delineated in a single layer present on a substrate by a multi-exposure method. The electron beam measurement apparatus including means for classifying the patterns in the plurality of images into a plurality of groups according to an exposure history record by irradiating patterns present on the sample with the electron beam to acquire a plurality of images respectively indicating regions that mostly overlap each other under respective conditions different from each other.

(9) The electron beam measurement apparatus having the configuration described in item (8), wherein the multi-exposure method uses a double patterning technique.

(10) The electron beam measurement apparatus having the configuration described in item (8), wherein the image formed based on the detected charged particle is a scanning electron microscope image.

According to the present invention, it is possible to realize an electron beam measurement technique capable of measuring the shape or size of a portion of a pattern delineated on a sample by a multi-exposure method or detecting a defect or the like.

DETAILED DESCRIPTION OF THE PREFERRED EMBODIMENTS

Embodiments of the present invention will be described with reference to the accompanying drawings.

First Embodiment

First, a basic configuration of an electron beam measurement apparatus according to the present invention will be described.

Figure 2:
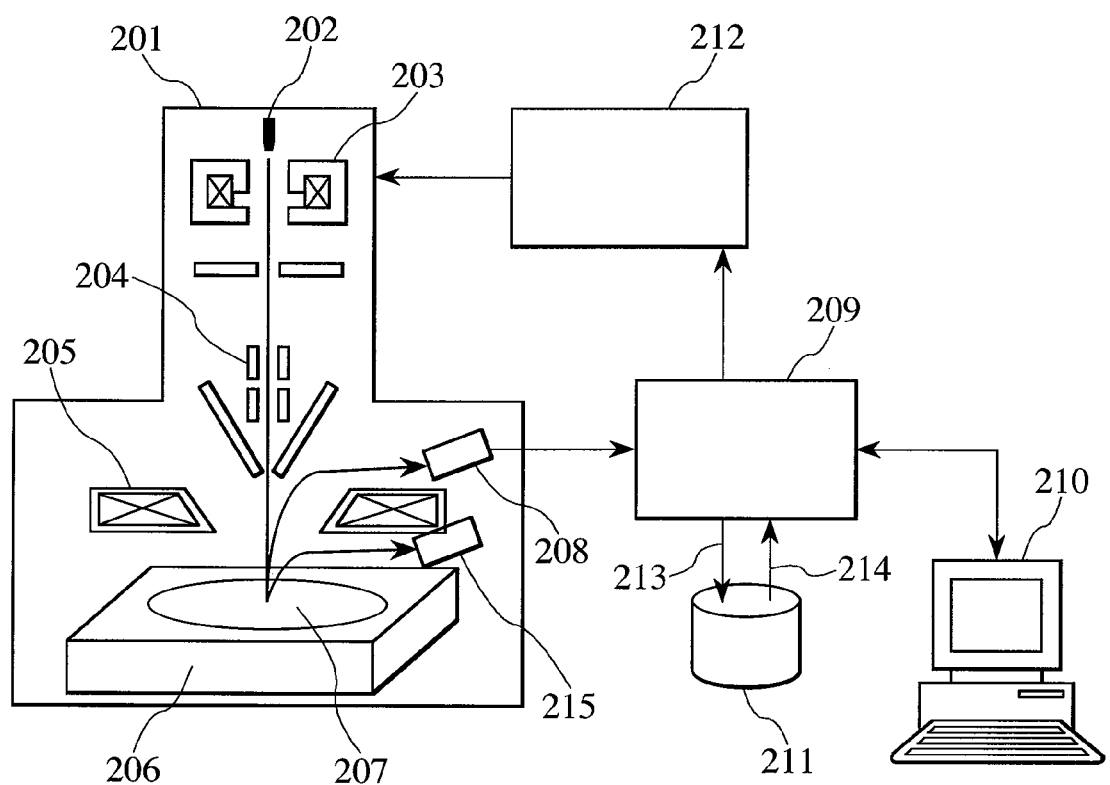
FIG. 2 is a diagram showing a basic configuration of an electron beam measurement apparatus according to the present invention.

FIG. 2 is a diagram showing the basic configuration of the electron beam measurement apparatus according to the present invention. The electron beam measurement apparatus has an electron optical system 201, a secondary electron detector 208, a reflective electron detector 215, a computing unit 209, a display unit 210, a storage unit 211, and an electron optical system controller 212. The electron optical system 201 uses a condenser lens 203, a deflector 204 and an objective lens 205 to irradiate a sample (wafer) 207 placed on a stage 206 with an electron beam emitted by an electron gun 202 and scan the sample. The secondary electron detector 208 is adapted to detect the intensity of a charged particle (secondary electron) secondarily generated from the sample 207 by the irradiation of the electron beam. The reflective electron detector 215 is adapted to detect the intensity of a charged particle (reflective electron) secondarily generated from the sample 207 by the irradiation of the electron beam. The computing unit 209 is adapted to process the waveform of a signal obtained from the detected charged particle to calculate a characteristic value. The display unit 210 displays, through an input performed by an operator, a scanning electron microscope (SEM) image. The storage unit 211 stores data. The electron optical system controller 212 reflects a condition for the irradiation with the electron beam to the electron optical system to control the electron optical system.

It should be noted that reference numeral 213 shown in FIG. 2 denotes flow of data (e.g., flow of a computed result) to be stored in the storage unit 211, and reference numeral 214 shown in FIG. 2 denotes flow of data read out from the storage unit 211.

Figure 3:
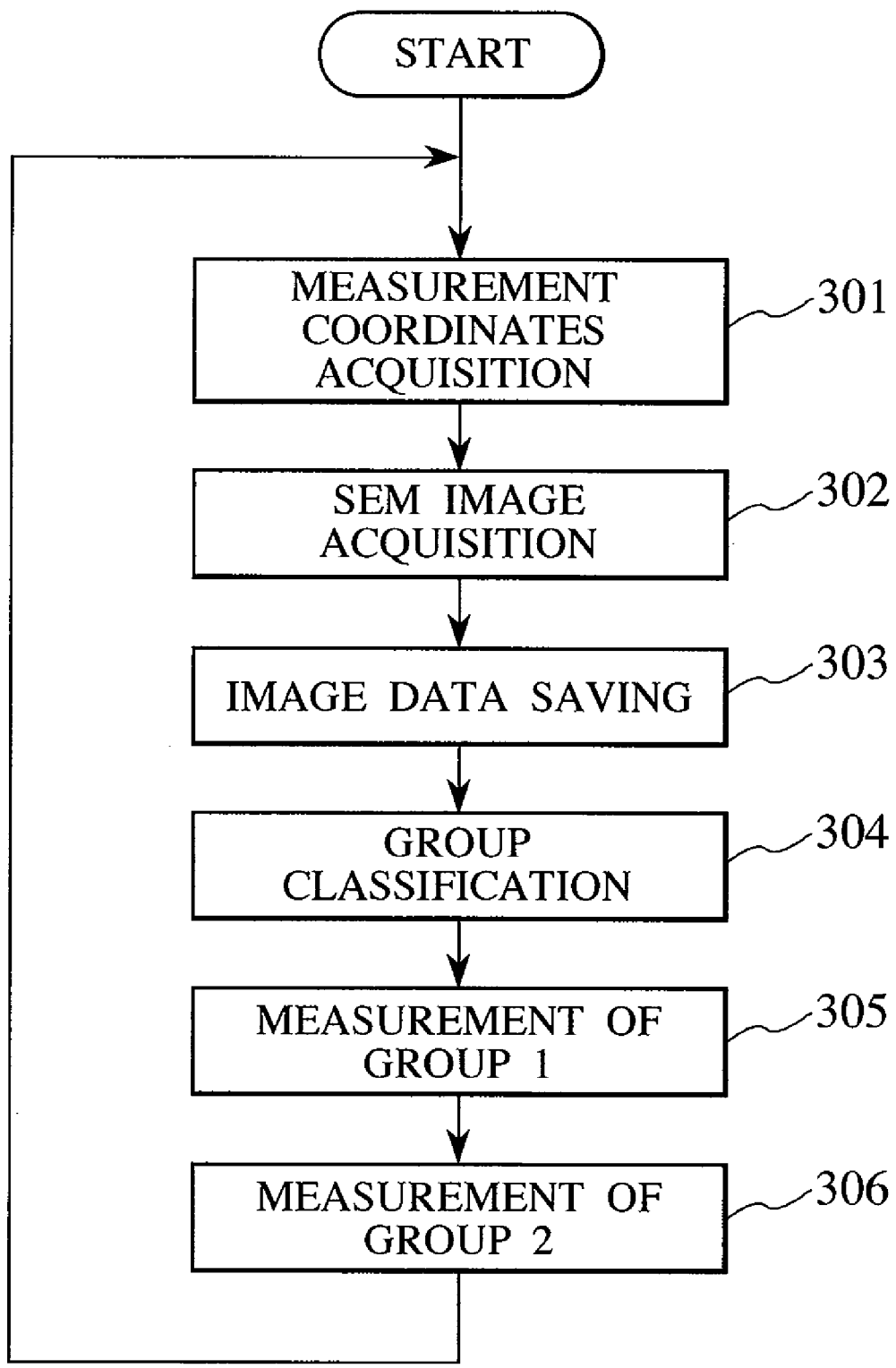
FIG. 3 is a flowchart showing a basic measurement according to the present invention.

FIG. 3 is a flowchart showing a basic measurement according to the present invention. First, coordinates of an area to be measured are acquired in step 301. The scanning electron microscope (SEM) image of the region located at the coordinates is acquired by means of a secondary electron in step 302. Data on the acquired image is stored in the storage unit 211 in step 303. Patterns within the acquired image are classified into two groups (group 1 and group 2) in accordance with a predetermined rule in step 303. The size of a portion of a pattern of each group is calculated in accordance with a predetermined algorithm in steps 305 and 306.

It can be determined whether or not each exposure process is properly performed by determining whether or not each calculated size is in a predetermined range. If there is a group including a pattern having a portion of which the size is not in a predetermined range, a process condition for a corresponding exposure process is reviewed. In the abovementioned way, it is possible to control processes of a multi-exposure method according to the present invention.

Figure 4:
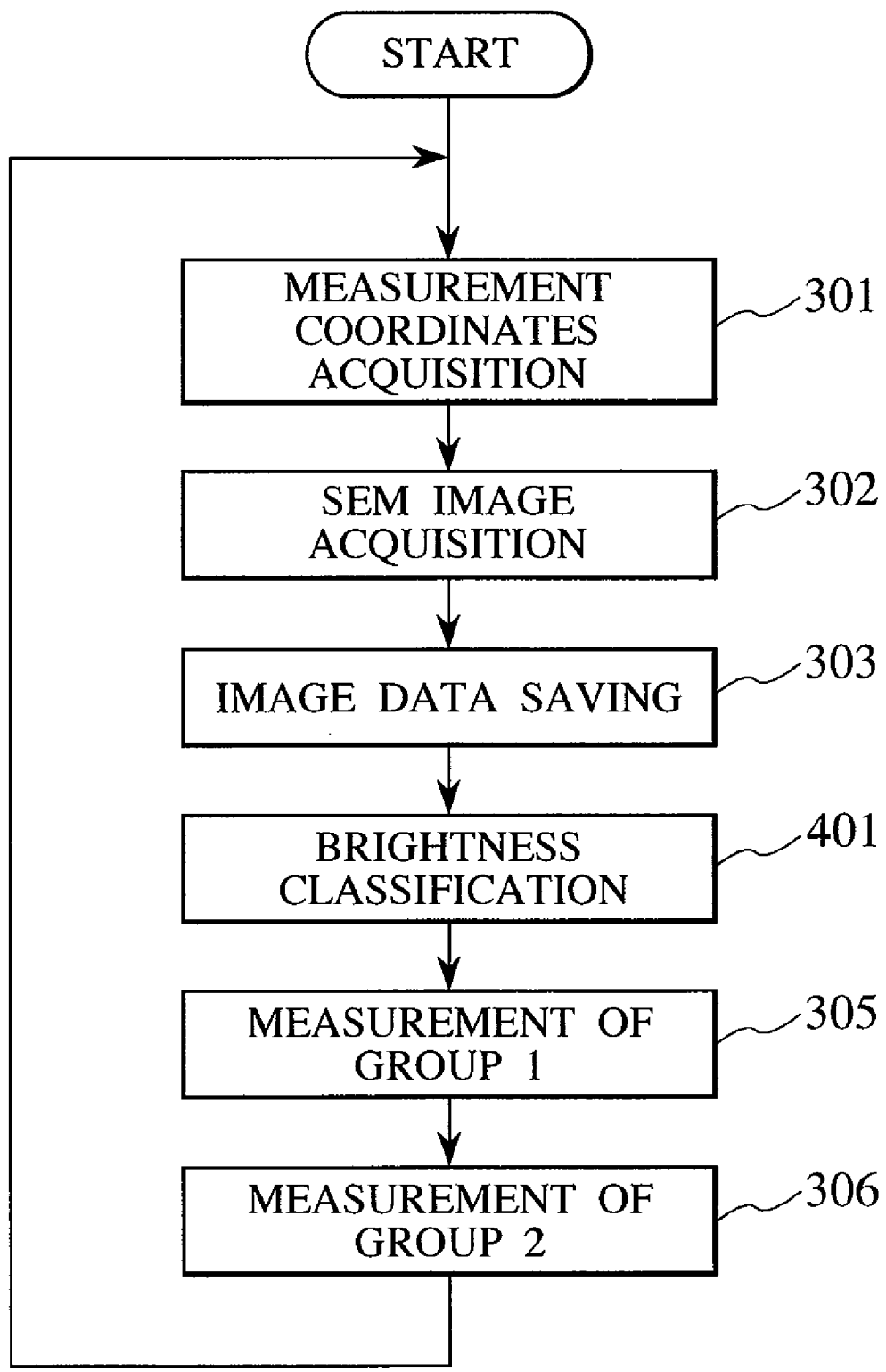
FIG. 4 is a flowchart showing a measurement according to a first embodiment of the present invention.

The present embodiment will be described with reference to FIG. 4.

Figure 1A:
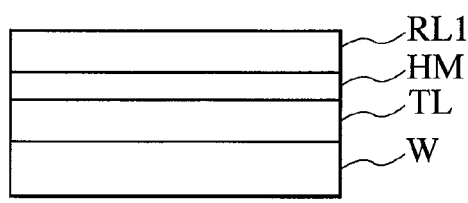
FIGS. 1A to 1G are diagrams showing an example of a process flow of a multi-exposure method.
Figure 1B:
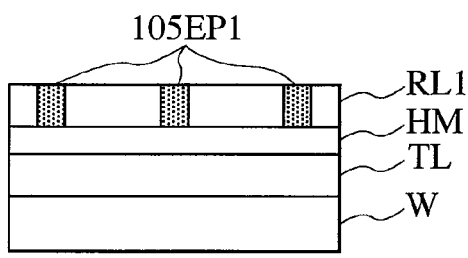
Figure 1C:
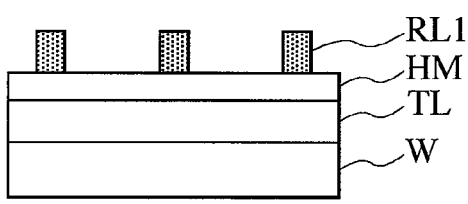
Figure 1D:
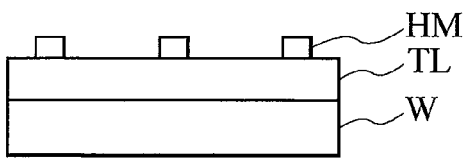
Figure 1E:
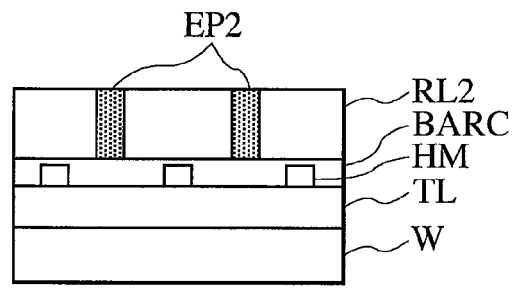
Figure 1F:
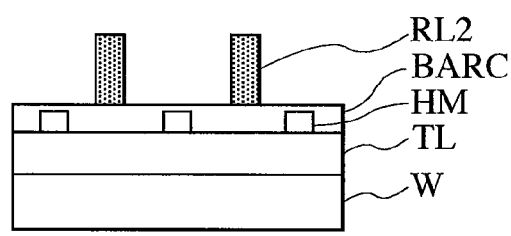
Figure 1G:
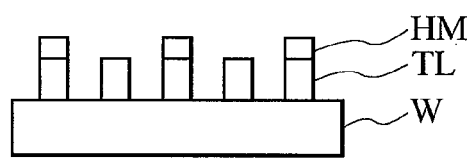
Figure 9:
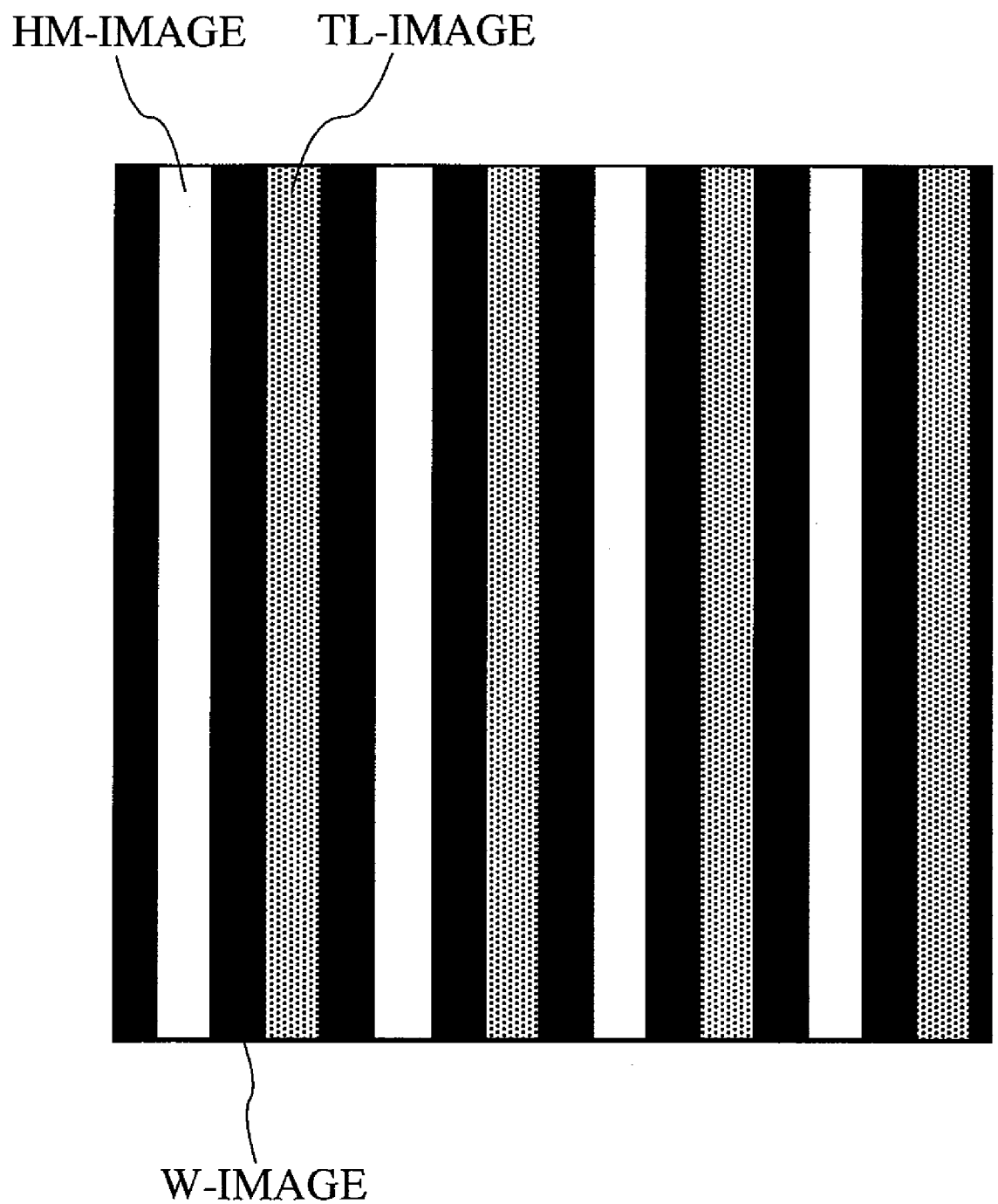
FIG. 9 is a diagram showing an example of a scanning electron microscope (SEM) image.

In the present embodiment, an SEM image of the sample in the state shown in FIG. 1G is acquired. FIG. 9 is a schematic diagram showing the SEM image. A pattern shown in FIG. 9 is part of a flash memory pattern. A portion of the pattern shown in FIG. 9, which corresponds to a portion (at which the hard mask layer HM remains after a first exposure) of the sample, has higher contrast with the substrate than that of a portion of the pattern shown in FIG. 9, which corresponds to a portion (at which the hard mask layer HM does not remain and the processed layer remains after a second exposure) of the sample.

As an example of the classification method shown in FIG. 3, it is possible to classify patterns into two patterns: a pattern delineated by the first exposure; and a pattern delineated by the second exposure, in accordance with brightness of the patterns (in step 401). When the pattern includes a defect, it is possible to easily determine which exposure process has a problem.

In addition, the algorithm for calculating the size of a portion of the pattern can be changed to another algorithm for calculating the size of the portion. An SEM image of a certain portion (of the pattern) is viewed differently from an SEM image of another portion (of the pattern) having a height different from that of the certain portion and having other dimensions that are the same as those of the certain portion. It is therefore necessary to change the algorithm based on the portion of the pattern in order to optimally measure the portion. In the present embodiment, the size of the portion of the pattern is calculated based on coordinates of an intersection of a signal waveform and a slice level. A slice level for the hard mask layer HM is high, while a slice level for the processed layer TL is low. It is possible to set a plurality of slice levels in the electron beam measurement apparatus according to the present embodiment.

In the present embodiment, dimensional control is carried out by using the average of widths of a plurality of lines formed in each layer as the size of a portion of the pattern. However, the dimensional control may be carried out by using the width of one line located at a central portion of each layer.

In order to classify patterns into groups, it is effective to use a difference between white bands. The white bands are waveforms of signals coming from edge portions of the patterns when an SEM performs irradiation with an electron beam. In addition, reference waveforms may be used to calculate the sizes of pattern portions.

In a conventional technique, a measurement error between a first exposure layer and a second exposure layer is 3 nm. According to the present invention, however, a measurement error between exposed layers is 0.2 nm. In addition, although a reproducible error in the conventional technique is 0.6 nm, a reproducible error in the present invention is 0.3 nm.

Second Embodiment

Figure 5:
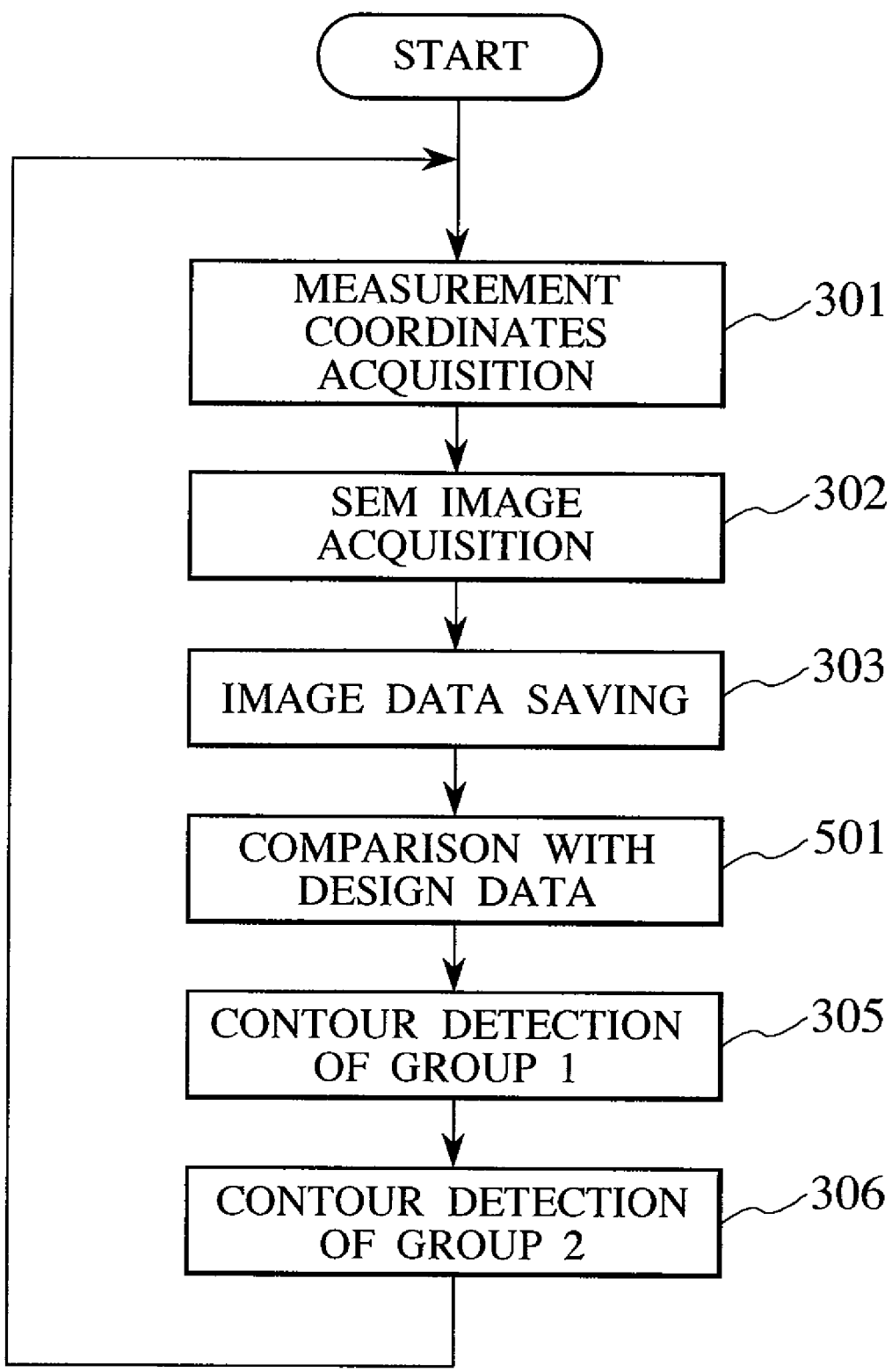
FIG. 5 is a flowchart showing a measurement according to a second embodiment of the present invention.

FIG. 5 is a flowchart of the measurement according to a second embodiment of the present invention. In the measurement shown in FIG. 5, after an SEM image is acquired, patterns are classified into groups by comparing the SEM image with design data, in step 501. In the pattern (shown in FIG. 9) having lines and spaces which are alternately arranged, matching of the pattern may be performed with a single pitch shifted. This measurement method shown in FIG. 5 is suitable for a logic LSI having a complex pattern. It can be considered that a combination of this measurement method shown in FIG. 5 with the classification method based on the brightness in the first embodiment is effective.

According to the present embodiment, the contour of a portion of each pattern is detected, and the length of the contour is evaluated, to inspect a hot spot (which is a location at which a defect is likely to occur). As a result, detection sensitivity can be improved in the present embodiment, compared with the conventional technique.

Third Embodiment

Figure 6:
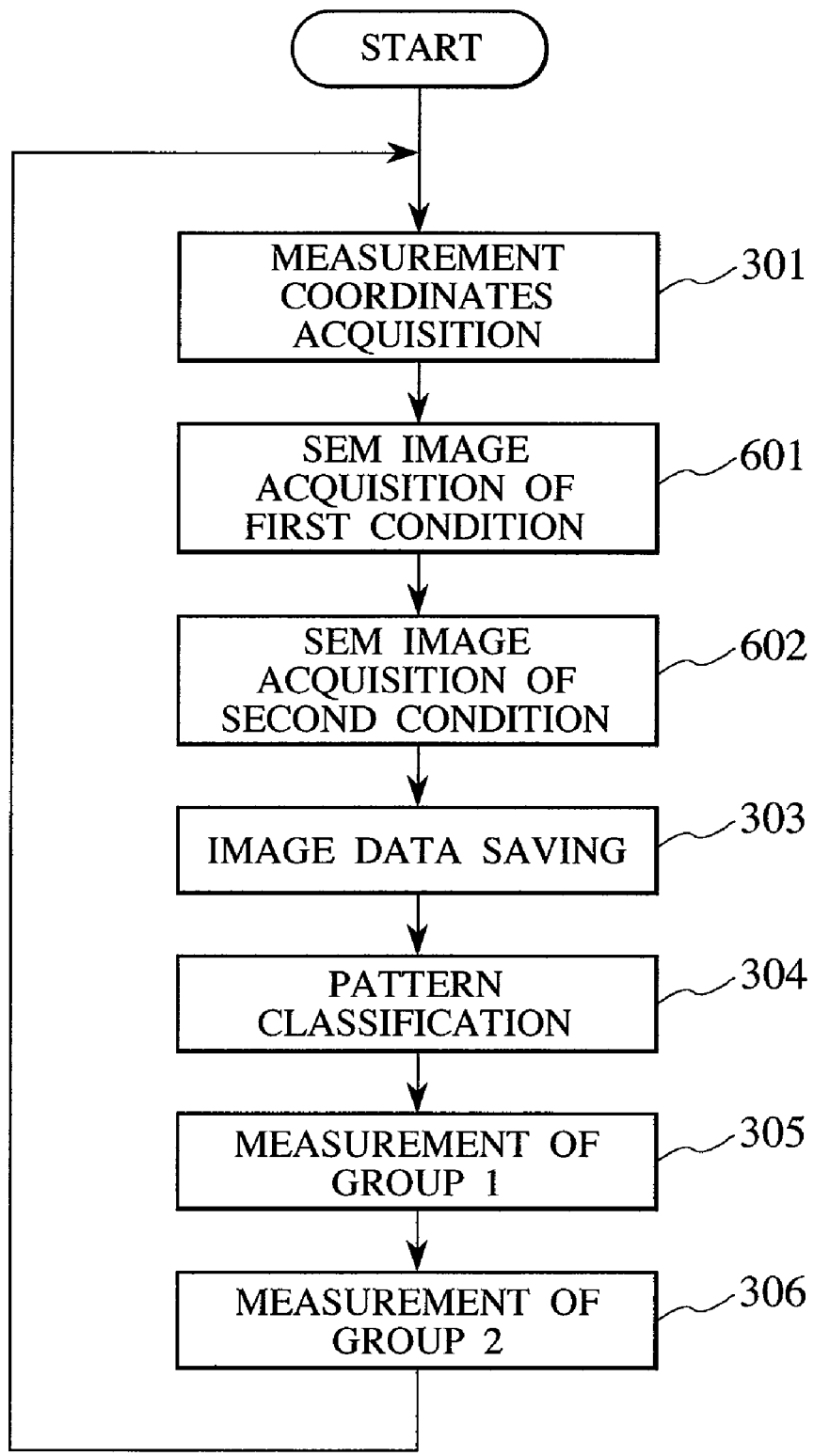
FIG. 6 is a flowchart showing a measurement according to a third embodiment of the present invention.

FIG. 6 is a flowchart showing a measurement according to a third embodiment of the present invention. In the present embodiment, a plurality of images is used. After the sample is moved to a location defined by coordinates of an area to be imaged, a single SEM image is acquired under a first condition in step 601, and a single SEM image is acquired in step 602 under a second condition different from the first condition. Under the first condition, the number of times of scanning of an observation area is eight. Under the second condition, the number of times of television scanning of the observation area is 32. The reason for acquiring the images under the conditions different from each other is that the intensity of a signal coming from the processed layer is low. Thus, the number of times of the scanning under the second condition is 32 in order to improve a signal-to-noise ratio. The intensity of a signal coming from the hard mask layer is too high when the image acquisition is performed under the second condition. Thus, a detected signal is saturated.

After the patterns are classified, the size of the hard mask layer is obtained based on the image acquired under the first condition, and the size of the processed layer is obtained based on the image acquired under the second condition. As a result, a reproducible error is reduced to 0.25 nm.

Fourth Embodiment

Figure 7:
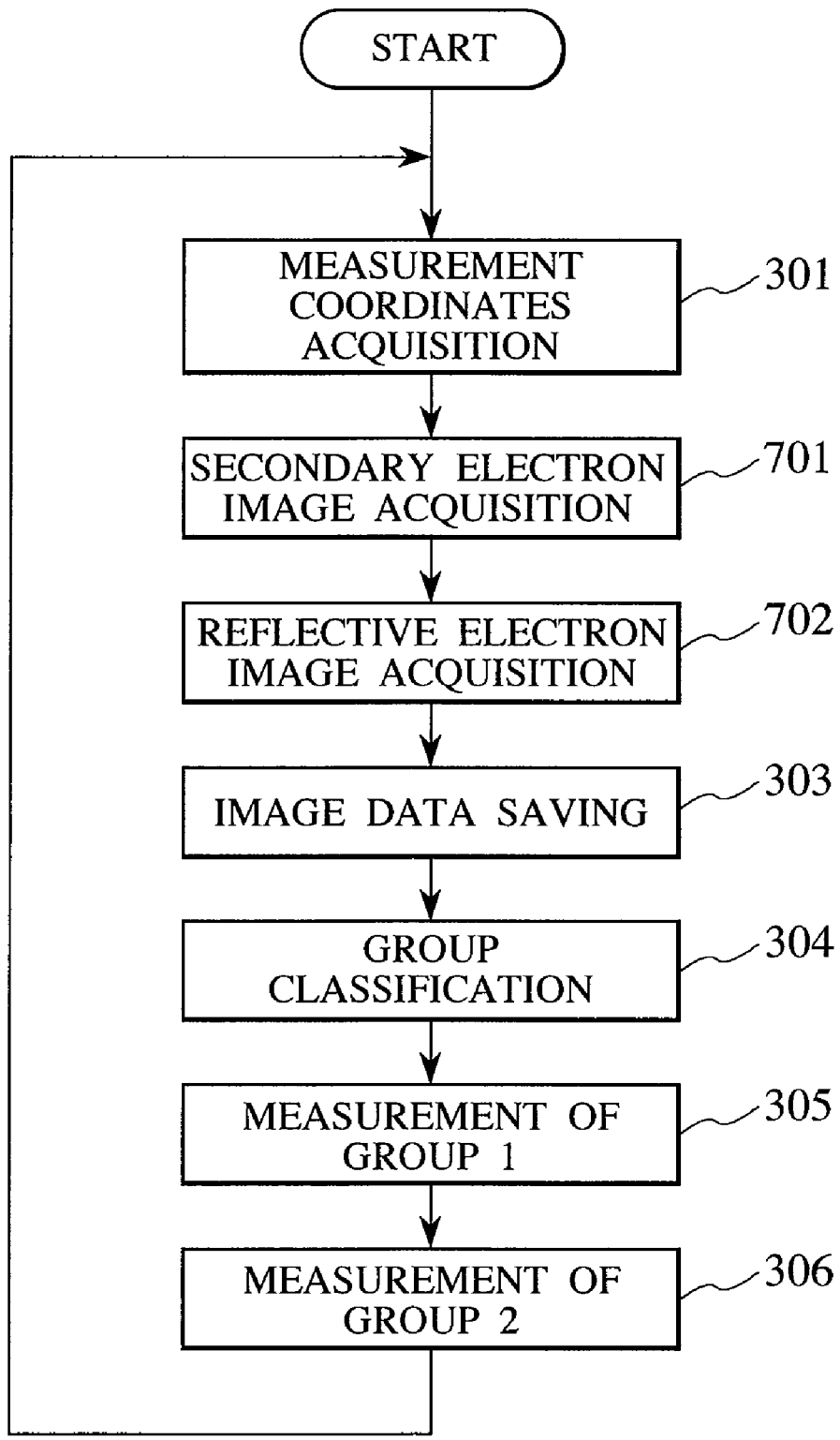
FIG. 7 is a flowchart showing a measurement according to a fourth embodiment of the present invention.

FIG. 7 is a flowchart showing a measurement according to a fourth embodiment of the present invention. In the fourth embodiment, a plurality of images is used. The sample shown in FIG. 1F is used only in the fourth embodiment. After the sample is moved to a location defined by acquired coordinates of an area to be measured, a single SEM image is acquired by using a secondary electron in step 701 and a single SEM image is acquired by using a reflective electron in step 702. The second resist layer RL 2 shown in FIG. 1F can be easily observed. It is not easy to observe the hard mask layer HM since the hard mask layer HM is covered with the antireflection film BARC.

Figure 10A:
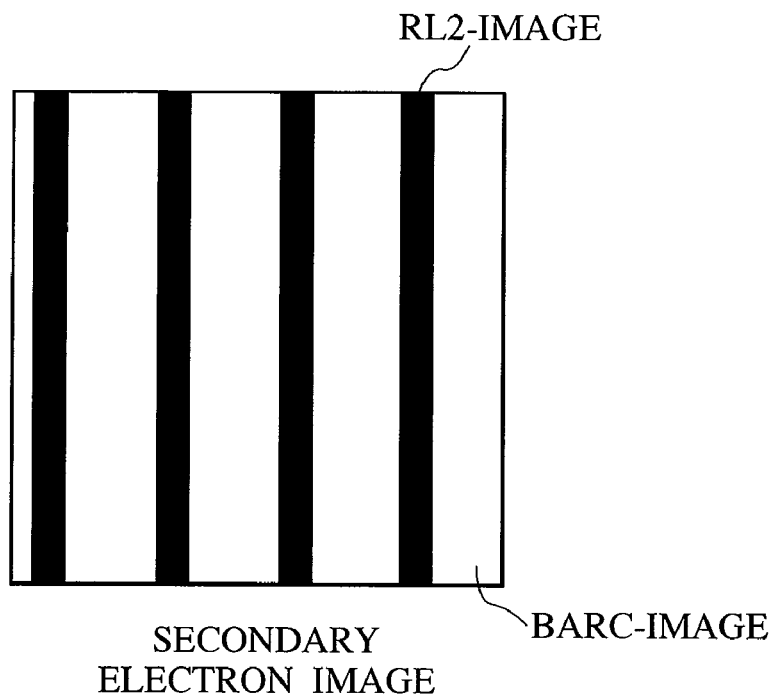
FIG. 10A is a diagram showing a secondary electron image.
Figure 10B:
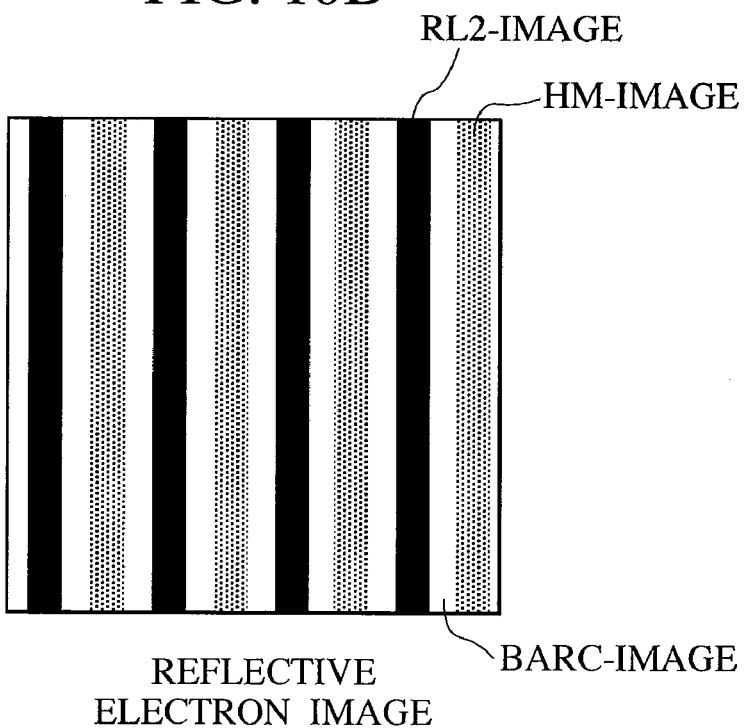
FIG. 10B is a diagram showing a reflective electron image.

In order to observe the hard mask layer HM, a reflective electron is used. This results from the fact that the escape depth (to allow the reflective electron to escape from the sample) of the reflective electron is large. FIGS. 10A and 10B are diagrams showing the image (secondary electron image) acquired by using the secondary electron and the image (reflective electron image) acquired by using the reflective electron image, respectively. In the secondary electron image shown in FIG. 10A, an image of the second resist layer RL2 is observed. In the reflective electron image shown in FIG. 10B, an image of the second resist layer RL2 and an image of the hard mask layer HM are observed. In this method, the two images can be acquired simultaneously. The throughput of the electron beam measurement apparatus is therefore not reduced. In addition, it is easy to classify the patterns into groups based on the two images. The size of the second resist layer RL2 is obtained by using the second electron image having high contrast, while the size of the hard mask layer HM is obtained by using the reflective electron image having contrast.

As a result, the sample shown in FIG. 1F (which cannot be measured by a conventional technique) can be measured with a reproducible error of 0.5 nm. In addition, since the processed layer TL is not etched in the state shown in FIG. 1F, it is easy to reproduce the sample by re-performing the manufacturing process from the exposure process.

Fifth Embodiment

Figure 8:
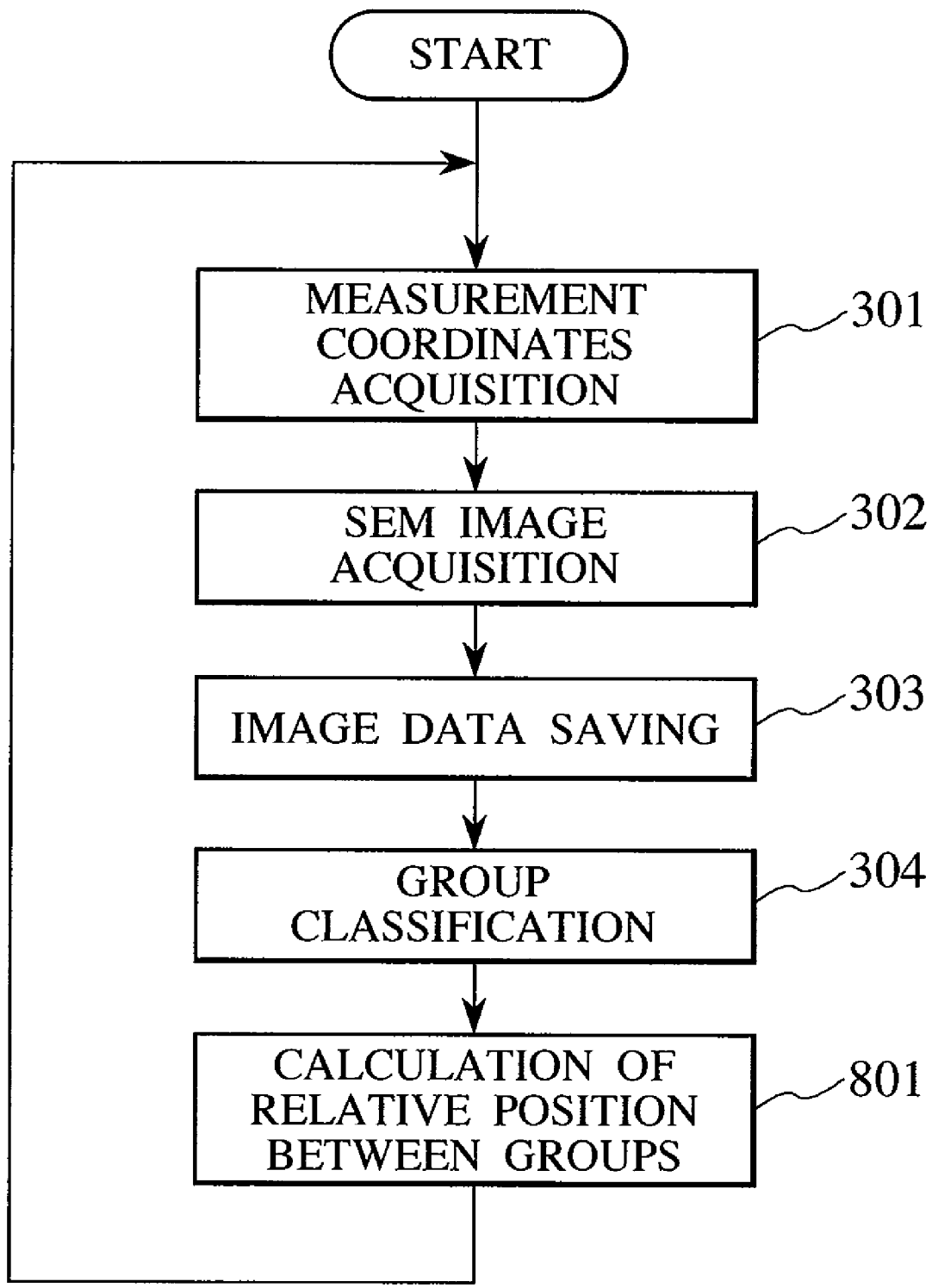
FIG. 8 is a flowchart showing a measurement according to a fifth embodiment of the present invention.

FIG. 8 is a flowchart showing a measurement according to a fifth embodiment of the present invention. After patterns are classified into groups, a relative positional relationship between the groups is detected in step 801. This is different from the other embodiments. The relative positional relationship between the groups means the amount of a superposition error between a pattern subjected to an exposure and a pattern subjected to another exposure. More specifically, the relative positional relationship (positional error) in an X direction is obtained by using the center of the contour (extending in a Y direction) of the pattern as a reference, while the relative positional relationship (positional error) in a Y direction is obtained by using the center of the contour (extending in an X direction) of the pattern as a reference. The superposition error between the pattern subjected to the exposure and pattern subjected to the other exposure is very important in order to measure the length of a space between the pattern portions, and the size of a portion of the pattern subjected to a multi-exposure. Since this method is not carried out in conventional techniques, it is necessary that the apparatus automatically classify the patterns into groups.

In the present embodiment, after the patterns are classified based on the brightness, and the contour of each pattern is obtained, the superposition error is obtained. When the superposition error is large, the exposure process is re-performed. This contributes to improvement in the yield of semiconductors.

In the embodiments of the present invention, a scanning electron microscope using an electron beam is described as an example. The basic concept of the present invention is not limited to this. Another microscope using a charged particle beam such as an ion beam can be applied to the present invention.

According to the present invention, it is possible to measure, with high accuracy, the sizes of portions (having shapes different from each other in a vertical direction) of a pattern on a sample subjected to a multi-exposure and a relative positional relationship between groups. Furthermore, it is possible to smoothly control a lithographic process and an etching process.

What is claimed is:

1. An electron beam measurement apparatus, which measures, based on information on an image, a pattern formed on a sample, comprising an electron optical system that has a lens and a deflector and scans a predetermined observation region on the sample with an electron beam emitted from an electron source, a detector for detecting a charged particle secondarily generated from the sample by irradiation with the electron beam, and means for forming an image based on the detected charged particle, the patterns being delineated in a single layer present on a substrate by a multi-exposure method, the electron beam measurement apparatus including:
    means for classifying patterns, which are included in an image acquired by the irradiation with the electron beam on the patterns on the sample, into groups according to an exposure history record, the exposure history record being acquired based on brightness of the patterns included in the image and a difference between shapes of white bands of the patterns.

2. The electron beam measurement apparatus according to claim 1, wherein
    the patterns are classified into the groups based on an image formed based on a secondary electron of the charged particle and an image formed based on a reflective electron of the charged particle.

3. The electron beam measurement apparatus according to claim 1, wherein
    the patterns are classified into the groups according to the exposure history record by comparing the acquired image with a design database.

4. The electron beam measurement apparatus according to claim 1, wherein
    the patterns are classified into the groups such that a pattern having portion arranged alternately is included in one of the groups that is different from the other group including the other pattern.

5. The electron beam measurement apparatus according to claim 1, wherein
    an image processing parameter or an waveform processing parameter is used for each of the classified groups to obtain the size of a portion of the pattern included in the group or the position of the contour of the portion of the pattern, the used parameter varying depending on the group.

6. The electron beam measurement apparatus according to claim 1, wherein
    a reference image or a reference waveform is used for each of the classified groups to obtain the size of a portion of the pattern included in the group or the position of the contour of the portion of the pattern, the used reference image or the used reference waveform varying depending on the group.

7. The electron beam measurement apparatus according to claim 1, wherein
    information on a relative positional relationship between the classified groups is obtained.

8. An electron beam measurement apparatus, which measures, based on information on an image, a pattern formed on a sample, comprising an electron optical system that has a lens and a deflector and scans a predetermined observation region on a sample with an electron beam emitted from an electron source, a detector for detecting a charged particle secondarily generated from the sample by irradiation with the electron beam, and means for forming an image based on the detected charged particle, the patterns being delineated in a single layer present on a substrate by a multi-exposure method, the electron beam measurement apparatus including:
    means for classifying the patterns in the plurality of images into a plurality of groups according to an exposure history record by irradiating patterns with the electron beam to acquire a plurality of images respectively indicating regions that mostly overlap each other under respective image acquisition conditions different from each other, wherein
    any of the images that is acquired under any of the image acquisition conditions is used for any of the groups to obtain the size of a portion of the pattern included in the group or the position of the contour of the portion of the pattern, the image acquisition condition varying depending on the group.

9. The electron beam measurement apparatus according to claim 1, wherein
    the patterns are delineated on the sample by a double patterning technique.

10. The electron beam measurement apparatus according to claim 1, wherein
the image formed based on the detected charged particle is a scanning electron microscope image.

11. The electron beam measurement apparatus according to claim 8, wherein
the patterns are delineated on the sample by a double patterning technique.

12. The electron beam measurement apparatus according to claim 8, wherein
the image formed based on the detected charged particle is a scanning electron microscope image.

* * * * *